United States Patent [19]

Bingham et al.

[11] 4,118,523
[45] Oct. 3, 1978

[54] PRODUCTION OF SEMICONDUCTOR DEVICES

[75] Inventors: Kenneth Charles Arthur Bingham, Macclesfield; Alan George Albert Gillingham, Disley; Colin Baldwin, Altringham, all of England

[73] Assignee: International Computers Limited, London, England

[21] Appl. No.: 852,392

[22] Filed: Nov. 17, 1977

Related U.S. Application Data

[63] Continuation of Ser. No. 730,947, Oct. 8, 1976, abandoned.

[30] Foreign Application Priority Data

Oct. 22, 1975 [GB] United Kingdom ............... 43289/75

[51] Int. Cl.² ........................... B05D 5/12; H05K 3/00
[52] U.S. Cl. ........................................ 427/97; 427/98; 427/264; 427/271; 427/307; 156/633; 156/634; 156/644; 156/656; 156/668

[58] Field of Search ...................... 427/82, 88, 89, 92, 427/97, 98, 103, 155, 307, 264, 271, 343; 156/633, 656, 634, 668, 644

[56] References Cited

U.S. PATENT DOCUMENTS

| | | | |
|---|---|---|---|
| 3,268,653 | 8/1966 | McNutt | 427/97 |
| 3,620,933 | 11/1971 | Grunwald | 427/97 |
| 3,702,284 | 11/1972 | Merkenschlager | 427/97 |
| 3,937,857 | 2/1976 | Brunnett | 427/307 |
| 4,023,999 | 5/1977 | Lindberg | 427/97 |

Primary Examiner—Michael F. Esposito
Attorney, Agent, or Firm—Misegades, Douglas & Levy

[57] ABSTRACT

A method of forming very small diameter holes in a flexible substrate by coating both sides of substrate with metal layers; etching layers and substrate at places where holes required, removing small ring of the metal layers surrounding holes to remove any overhang of metal; and plating walls of holes and providing electrical conduction with said layers.

1 Claim, 8 Drawing Figures

PRODUCTION OF SEMICONDUCTOR DEVICES

CROSS REFERENCE TO PRIOR APPLICATIONS

The application is a continuation under 37 C.F.R. 1.60 of our application Ser. No. 730,947 filed Oct. 8, 1976, Group 165, now abandoned.

BACKGROUND OF THE INVENTION

1. Field of the Invention

This invention relates to the formation of printed circuits arrangements involving through holes in a layer of insulation or substrate for enabling electrical interconnection between conductive material provided on opposite sides of the insulation layer or the substrate.

Present day printed circuit arrangements frequently include a substrate and several layers of electrically conductive planes and/or conductive systems separated and electrically insulated from each other by layers of insulation, and which have mounted thereon circuit elements which operatively connect with the conductor planes.

Hitherto the formation of such circuits has involved the successive application of layers of conductive materials and the insulation materials. In practice, this has been found to lead to relatively low production yields since any production errors in the latter stages of production results in rejection of the complete circuit arrangement.

With a view to overcoming these problems, it has been proposed to divide the construction of the circuit arrangements into at least two principal units.

The first unit comprises a metallic substrate, which is intended to provide for dissipation of heat generated during operation, and which also provides the support for power supply layers. The second unit comprises a flexible plastic film which carries on opposite faces thereof conductive layers which provide continuous layers or conductive patterns which provide the signal connection paths of the circuit arrangement and some of the power connections linking the circuit components connected with the completed circuit or arrangement, and mounted on the second unit.

The substrate of the second component can comprise a layer of polyimide film which, for example, has a thickness of 25 um or 50 um.

The present invention is particularly concerned with the formation of this second unit and more particularly concerned with overcoming certain difficulties which have been found to arise in connection with the formation of through-holes in the then flexible substrate and the subsequent covering of the walls of the holes with an electrically conductive metal layer to provide an electrically conductive path from one end of the hole to the other.

The formation of such plated holes providing electrical continuity from one surface of the substrate to the other has met with considerable difficulty which has been found to stem from the use of a very thin layer of a flexible material.

In a previously used method of preparing the double sided printed circuit arrangements having through holes mechanically to drill, the substrate is covered on both surfaces with a metallized coating, holes are then etched through the metalized coating the the substrate, and the walls of the holes are then plated after the removal of the metalised layers since it had been found that their retention prevented the reliable plating of the walls of the holes. After the hole plating the substrate is reprocessed by application of various layers of metallic material and insulation to provide the required electrical conductor patterns.

In practice, it has been found that the execution of the above process - although enabling the plating of the holes to obtain a satisfactory conductive path introduced a further difficulty in that the removal of the metalised layers allowed the flexible substrate to relax. This relaxation causes unpredictable relative movements of the holes with respect to subsequent masks and the associated conductive layers. Consequently, when the conductor patterns were produced by the conventional photo-resist and mask technique which required the holes to be located in very precise locations in the substrate, the holes were not always correctly positioned with respect to the conductors.

It is an object of the present invention to overcome this difficulty.

SUMMARIES OF THE INVENTION

Broadly, according to a first aspect of the invention there is provided a method of producing an electrical circuit arrangement having a substrate with a pattern of conductors on at least one surface thereof and a conductive plane or further pattern of conductors on the other surface, including the steps of providing a continuous coating of metal on both surfaces of a flexible substrate, removing portions of the metal coating to expose the substrate at each of the locations at which it is required to form a hole in the substrate, etching the substrate so as to produce the holes; removing a ring of metal from the vicinity of each end of each hole thereby to expose a ring of substrate surface around each end of each hole; plating the walls of the holes and said exposed rings of substrate so as to produce electrical continuity between the metal coatings on the surfaces of the substrate, and forming from at least one of the metal coatings or from each metal coating a pattern of conductors.

According to a second aspect of the invention there is provided a method of forming a printed circuit arrangement having conductive areas provided on opposite surfaces of a flexible substrate and through holes with electrically conductive walls intererconnecting said areas; the method including the steps of forming the hole in the substrate by a chemical process; removing portions of the conductive areas to expose ring-like regions of the substrate including the periphery of each end of each hole, metallising the walls of the holes and said exposed regions of the substrate; and producing the required conductor patterns in the conductive areas.

BRIEF DESCRIPTION OF THE DRAWINGS

For a better understanding of the invention, and to show how the same may be carried into effect, reference will now be made to the accompanying drawings in which.

DESCRIPTION OF PREFERRED EMBODIMENT

Figure 1:
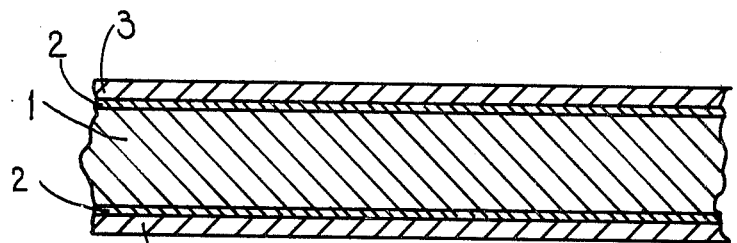
FIG. 1, is a cross-secrional view on enlarged scale of the substrate unit having upon opposed faces thereof a conductive layer of metal.

Referring to FIG. 1, a 25 um thick polyimide film 1 is coated on both surfaces with a thin layer 2 of chromium having a thickness of some 600 Angstroms and a layer of copper having a thickness of 0.1 to 0.5 um.

In order to be sure that there are no pin holes in the resultant sandwich of the substrate 1 and the layers 2, the layers 2 are coated with layers 3 of copper having a thickness of approximately 5 um. These additional layers 3 also help to reinforce the sandwich.

Figure 2:
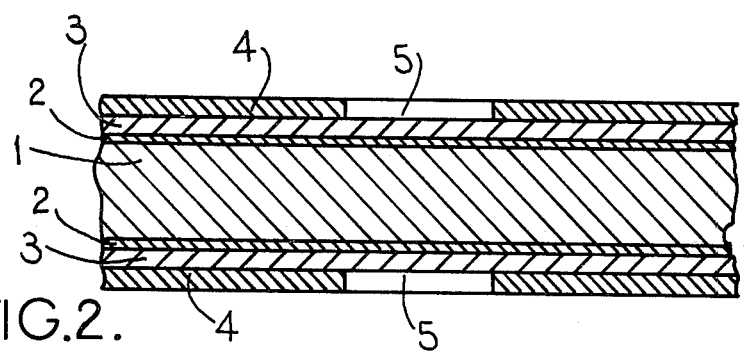
FIG. 2, is a cross-sectional view of the substrate unit of FIG. 1 with layers of photo resist defining through hole positions.

The metallized layers 3 are then coated with layers of photo resist 4 which can have a thickness of 3 um (FIG. 2). These two layers 4 are simultaneously exposed to ultra violet light through two mirror-imaged, but otherwise identical, masks which define the required positions 5 of holes to be formed in the substrate. These masks (not shown) are conveniently adjusted by means of alignment marks on the masks which are held in accurate registrations by a semi-conductor mask alignment device (not shown).

The photo resist layers are then developed so as to expose the locations 5 of the required holes on the surface of the layer 3.

Figure 3:
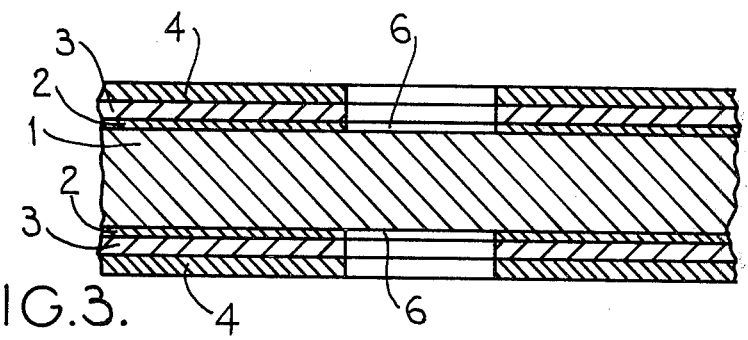
FIG. 3, is a cross-sectional view of the substrate unit of FIG. 2, after the formation of holes in the metal layers.

Following the development of the photo resist masks, the substrate 1 and the metallization layers 2, 3 are subjected to an etching operation in which both sides of the substrate and metal coatings sandwich are simultaneously subjected to etchants. The exposed areas of copper and chromium are respectively etched in ferric chloride (or ammoniacal etchant) and alkaline ferricyanide solutions to expose the surface regions 6 of the polyimide substrate 1. This is shown in FIG. 3.

The sandwich, which is contained in an oscillating jig (not shown) to cause turbulence at the exposed regions 6 of the polyimide substrate, is then etched in a hydrazine hydrate solution. This material will penetrate the substrate at a rate of approximately 25 um per hour. Since the etching material acts sideways as well as inwards into the substrate centre, the etching produces wider diamter regions at the ends of the holes being formed and a narrower diameter central region. Furthermore, since the metal is etched to a lesser extent there is a circumferential overhang 7.

Figure 4:
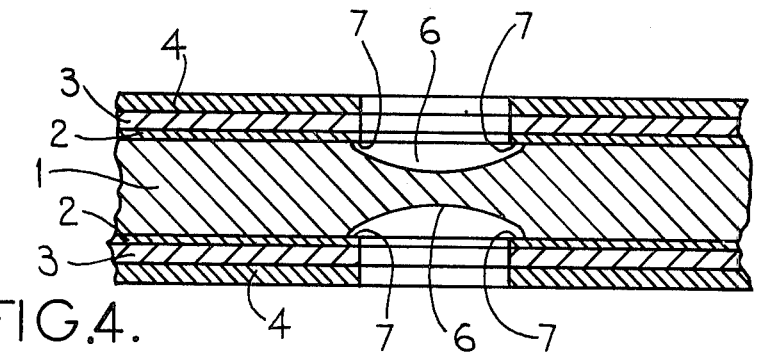
FIG. 4, is a cross-sectional view of the unit of FIG. 3 part way through the etching of through holes on the substrate.
Figure 5:
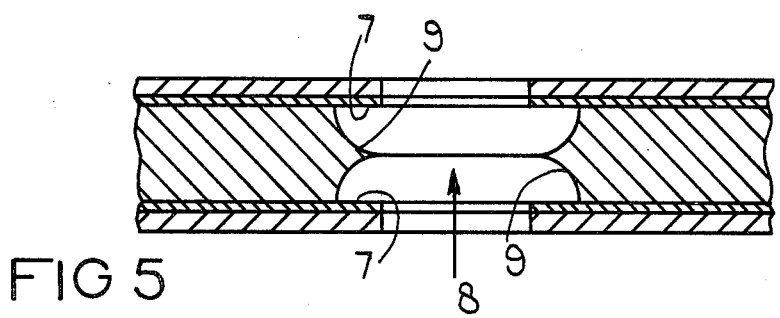
FIG. 5, is a cross-sectional view of the unit of FIG. 4 after formation of the through holes in the substrate.

FIG. 4 illustrates the situation during the process of etching the substrate. It will be seen that the overhang 7 is forming and that the exposed substrate surface regions 6 are beginning to spread laterally as well as downwards. At the end of the etching process the hole 8 has been formed. As will be seen from FIG. 5 the wall 9 of the hole has a cusp-like cross-section. In a practical instance when, for example, the diameter of the holes in the metallised part can be 38 um the diameter of the ends of the substrate holes will be 70 um and the diameter of the central region of the holes will be 25 um.

In order to provide the required electrical conductivity between the metallised layers it is necessary to plate or otherwise coat the wall 9 of the hole 8 with an electrical conductor. However, the overhanging regions 7 have been found to interfere with the application of the conductive layer on the hole walls. In the past, this difficulty has been overcome by removing the metalised coatings 2,3 and then recoating the surfaces of the substrate material having the holes therein, so that during the recoating process the walls of the holes become plated.

In practice, it has been found that the pattern of conductors, which is defined by the mask used to produce the patterns in the photo resist - are not always correctly positioned with respect to the holes in the substrate.

The Applicants' have found that these dimensional and positional inaccuracies arise from the fact that following the removal of the metallisation 2,3 from the polyimide substrate so as to remove the overhang 7 the polyimide film 1 relaxes and thus imports dimensional change in the substrate material which in turn displaces the holes with respect to each other and as consequence produces missalignment of the holes 8 relative to the masks defining the conductor patterns which are to be subsequently applied.

In accordance with the method of the present invention, the Applicants' have avoided this difficulty by retaining the originally formed metallisation layers 2, 3 after the formation of the holes, except for the regions of the layers immediately surrounding the etched through holes, which regions are removed by a second photo resist and etching process so as to expose a narrow annular band of substrate surface around the hole end.

This is effected as follows:

A further photo resist mask is applied to each of the faces of the sandwich, comprising the substrate, the metal coatings and the through holes. The further photo resist masks each define a pattern of holes which corresponds to the locations of the already formed holes, but which is such that each hole has a greater diameter than that of the formed substrate holes. The photo resist mask is exposed to ultra-violet light and developed.

Figure 6:
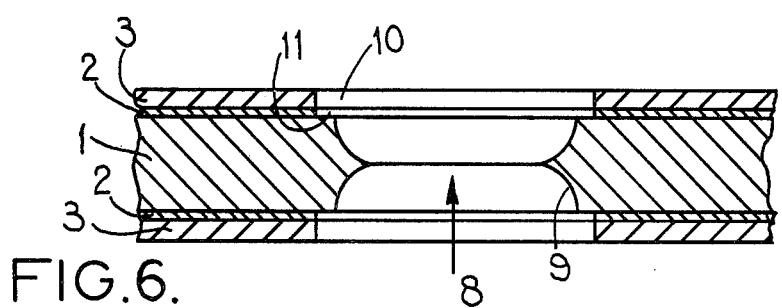
FIG. 6 is a cross-sectional view of the unit of FIG. 5 after removal of regions of metal layer the regions surrounding the end of each hole.
Figure 7:
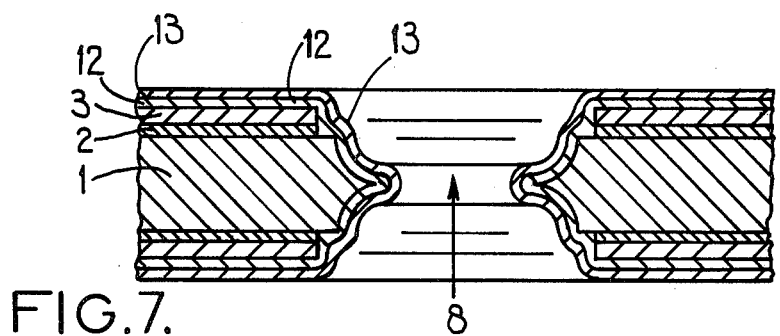
FIG. 7, is a cross-sectional view of the unit of FIG. 6 after plating the through holes.
Figure 8:
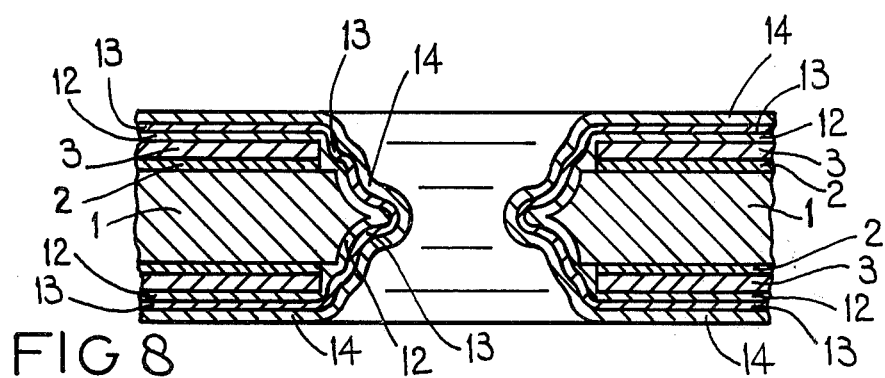
FIG. 8, is a cross-sectional view of the unit of FIG. 7 after formation of conductor patterns.

The sandwich is subjected to a further etching operation using the same etchants as previously mentioned which etches the metal exposed by the removal of the rings and in so doing etches away the metal overhang 7 together with a further ring of metal 10 so as to expose an annular ring 11 of polyimide around each through hole 8 in the polyimide substrate. After which the remainder of the photo resist material is removed. This position is shown in FIG. 6.

The walls 9 of the holes 8 and the annular rings 11 of exposed substrate are then electrolessly copper plated as at 12 to provide through hole electrical continuity from the metal layer on one surface of the substrate to the metal layer on the other surface of the substrate. In addition, with a view to reinforcing the through hole plating, a further layer of copper is deposited on the electroless layer 13 by an electroplating technique.

A new photo resist layer (not shown) is applied to both sides of the sandwich and these layers are exposed to ultra violet light through masks which define the pattern of conductors required on the faces of the substrate.

The photo resist layers are developed and the exposed substrate regions are electroplated with copper (or nickel) to a thickness of 25 um followed by a protective coating of tin-lead or gold to provide the conductors 14.

The last mentioned resist layers are removed and the sandwich with the conductors 14 is subjected to two etching operations which remove the 600° A. chromium film and the 5 um copper film from regions between the conductor regions so as to separate the conductors. This final etch can be effected using ferric chloride 30 gramme/liter when the conduction protective coating is gold or ammoniacel etchant when the protection is tin-lead or gold.

In the above process it will be observed that, the maximum amount of physical support for the polyimide substrate is provided throughout the formation of the through holes and the conductors, in that during hole formation and plating — only the polyimide regions actually defining the holes and the annular rings are not reinforced and positionally fixed by metal layers, and in that during the formation of the conductor pattern these are built-up on the metallic layers which reinforce the polyimide so that the substrate cannot relax following the hole formation and before the through hole plating and the formation of the conductive pattern.

We claim:

1. A method of electrically interconnecting conductors formed by first and second metal layers respectively on opposing faces of a polyimide substrate by a third electrically conductive layer within a bore extending through the substrate at a desired position, including the steps of:

(a) forming a hole in the first and second layers to expose underlying areas of the substrate, the holes in the said layers corresponding and being positioned opposite to one another at said desired position of the bore;

(b) applying simultaneously to both faces an etchant to act upon the said underlying areas of substrate to etch out the desired bore, the position of which is defined by the masking action of the remaining part of the first and second layers, but the effect of the etchant being such as to remove more substrate material adjacent to said layers than in the central part of the bore so as to produce an overhanging region of each such layer around the bore;

(c) then etching away further portions of the first and second layers to an extent sufficient to remove all of said overhanging regions and to expose the faces of the substrate immediately adjacent to the ends of the bore;

(d) and thereafter depositing the third conductive metal layer in the bore to form an electrically conductive connection between the first and second layers.

* * * * *